United States Patent
[19]

Lee et al.

[11] Patent Number: 6,010,637

[45] Date of Patent: Jan. 4, 2000

[54] METHOD AND APPARATUS FOR PREPARING A SAMPLE FOR OPTICAL ANALYSIS AND METHOD OF CONTROLLING THE APPARATUS

[75] Inventors: Chun-deuk Lee, Suwon; Kyoung-seop Lee, Yongin; Hyun-woon Lee, Yongin; Jung-keun Lee, Yongin, all of Rep. of Korea

[73] Assignee: Samsung Electronics Co., Ltd., Suwon, Rep. of Korea

[21] Appl. No.: 09/034,329

[22] Filed: Mar. 4, 1998

[30] Foreign Application Priority Data

Mar. 7, 1997 [KR] Rep. of Korea .................. 97-7775

[51] Int. Cl.$^7$ .................................................. C03C 25/06
[52] U.S. Cl. ................................ 216/96; 156/345; 134/2
[58] Field of Search ..................... 156/345; 118/718, 118/719, 715; 204/298.25, 298.35; 134/2, 18, 31, 44, 56 R; 216/96; 252/79.3

[56] References Cited

U.S. PATENT DOCUMENTS 5,540,821  7/1996  Tepman ............................. 204/192.13
5,686,314  11/1997  Miyazaki ............................ 436/177
5,730,801  3/1998  Tepman et al. ...................... 118/719

*Primary Examiner*—Bruce Breneman
*Assistant Examiner*—Alva C Powell
*Attorney, Agent, or Firm*—Jones Volentine, L.L.P.

[57] ABSTRACT

A method for preparing a sample for its optical analysis in the manufacture of a semiconductor device includes the step of drying a liquid formed on the semiconductor wafer until the concentration of contaminants contained in the liquid is of a sufficiently high level for the optical analyzer to adequately detect the contaminants. The liquid may be of a film formed on the wafer and dissolved into liquid drops, or deionized water or various chemicals to which the wafer is exposed during a manufacturing process. The apparatus includes a chuck for bringing the wafer into and out of a processing chamber, a guide for guiding the chuck, a piston cylinder for driving the chuck along the guide to a processing position, and a gas supplying system which directs nitrogen gas onto the wafer for drying the liquid. Appropriate controls are provided so that the apparatus can be operated automatically or manually.

15 Claims, 8 Drawing Sheets

METHOD AND APPARATUS FOR PREPARING A SAMPLE FOR OPTICAL ANALYSIS AND METHOD OF CONTROLLING THE APPARATUS

FIELD OF THE INVENTION

1. Field of the Invention

The present invention relates to a method and apparatus for preparing a sample for optical analysis, and to a method of controlling the apparatus, whereby contaminants that are produced in the manufacture of semiconductor devices can be detected and the causes thereof can be determined.

2. Description of the Related Art

Generally, semiconductor devices are manufactured by conducting a plurality of process steps on a wafer substrate. A wide variety of chemicals as well as deionized water are used during these processes.

The production yield of the semiconductor devices is greatly affected by the purity of the chemicals and the deionized water. For this reason, the degree to which the chemicals and the deionized water have become fouled or contaminated is analyzed in connection with the manufacturing process.

Moreover, contamination of the $SiO_2$ film on the wafer during processing can result in a damaged wafer. Therefore, the surface of the wafer is also analyzed for possible contaminants.

The surface analysis of the wafer involves detecting and analyzing the contaminants of the $SiO_2$ film. This is carried out by decomposing or breaking the $SiO_2$ film down into liquid drops and analyzing the residue inside the liquid drops.

The conventional method of analyzing the wafer surface will be explained using the flow chart of FIG. 1. Generally, the $SiO_2$ film is decomposed into liquid drops using hydrogen fluoride, the liquid drops are gathered, and then the liquid drops are subjected to analysis. FIGS. 2A, 2B and 2C are cross-sectional views illustrating the conventional method of processing a sample for optical analysis during the semiconductor device manufacturing process.

Referring to FIG. 1 and FIGS. 2A to 2C, the $SiO_2$ film 12, which contains a certain amount of contaminants, is formed on the wafer 10 with a thickness of approximately 5 Å to 10 Å as seen in FIG. 2A. A 1% aqueous solution of hydrogen fluoride is deposited on the wafer 10 (S2). The $SiO_2$ film 12 is dissolved and removed by the deposited hydrogen fluoride solution, and deionized water having contaminated residue remains on the wafer surface in the form of liquid drops 14 as seen in FIG. 2B.

The liquid drops 14, which are spread over the entire surface of the wafer, are gathered (S4) into a single larger liquid drop 16. This larger liquid drop 16 thus contains contaminants that were present over the entire wafer surface.

In the step (S4) in which the liquid drops 14 are formed into a single larger liquid drop 16, the wafer is adhered by vacuum absorption to a stage having a concave surface. The wafer is tipped or vibrated so that the liquid drops 14 accumulate at the bottom of the concave surface of the stage.

As shown in FIG. 2C, one liquid drop 16 having contaminated residue is formed, and this liquid drop 16 constitutes a sample including contaminated residue which was distributed over the entire wafer surface. The residue is analyzed using atom absorption optical analysis or a reflection X-ray analysis method of optical analysis.

As a result of the analysis, the contaminants within the liquid are detected and the reason why the film became contaminated is determined to thereby prevent the surface of subsequent wafers from being damaged.

Meanwhile, the analysis of chemicals or of deionized water used in the manufacturing process is also conducted by using a method similar to the liquid drop analysis method described above.

However, the conventional atom absorption optical analysis and reflection X-ray analysis each have a detection limit for the concentration of the residue inside the sample, which is about $10^7 \sim 10^8$ Atoms/cm$^2$. It is thus impossible to detect contaminants below about $10^7 \sim 10^8$ Atoms/cm$^2$.

Therefore, it is difficult to analyze a large liquid drop sample by using atom absorption optical analysis or reflection X-ray analysis, since the larger sized sample has a lower contamination concentration.

Since micro-contaminants can seriously affect the production of highly integrated semiconductor devices, especially 256 Mbit or 1 Gbit DRAM chips, a need exists for an apparatus and method for analyzing the liquid drops at contaminant concentration levels below about $10^7 \sim 10^8$ Atoms/cm$^2$.

SUMMARY OF THE INVENTION

An object of the present invention is to provide a method of processing a sample for optical analysis, during the manufacture of semiconductor devices, which allows micro-contaminants of the sample to be detected.

Another object of the present invention is to provide an apparatus for processing a sample for optical analysis, which dry-processes liquid drops into a sample such that the concentration of the residue inside the sample is increased.

Still another object of the present invention is to provide an apparatus for preparing a sample for optical analysis, but which can also be used as a simulation tool for freezing buffer oxide etchant.

A still further object of the present invention is to provide a method of controlling the apparatus for preparing a sample for optical analysis, wherein the operation includes steps taken to dry the sample.

The method of preparing a sample for optical analysis involves dissolving a film into liquid drops, and drying an accumulation of the liquid drops for a predetermined period of time. The drops are dried forcibly using regular air, and preferably warm air is used.

The above method of preparing a sample for optical analysis can also be applied to the chemicals or the deionized water that are used.

The apparatus for preparing a sample for optical analysis comprises a wafer holding means for loading/unloading a wafer into and from a processing room, and for holding the wafer as the liquid on the wafer is dried. A guide is provided for guiding the wafer holding means during the loading/unloading of the wafer. A driving means is fixed to the wafer holding means for driving the wafer holding means. A gas-supplying means introduces nitrogen gas onto the liquid on the wafer, and a controlling means controls the gas-supplying means and the driving means.

The wafer holding means preferably comprises a chuck. The chuck may be of a vacuum type which produces a vacuum to adhere the wafer to the chuck.

The driving means preferably comprises a piston cylinder which is integrated with the wafer holding means. The piston cylinder may receive hydraulic pressure from a first nitrogen gas supply source.

The gas-supplying means comprises a second nitrogen gas supply source, heating means for heating the nitrogen gas supplied from the second nitrogen gas supply source, and at least one valve for controlling the supply of nitrogen gas heated by the heating means.

In addition, the apparatus further comprises a cooling means for cooling nitrogen gas supplied from a third nitrogen gas supply source. Again, at least one valve controls the supply of the nitrogen gas cooled by the cooling means. The cooling means can cool the nitrogen gas to a temperature which freezes the buffer oxide etchant.

A controlling means, in the form of a programmable controller, is used to control the apparatus. If an automatic mode is selected, the controlling means operates the apparatus according to a program stored therein.

A method of controlling the apparatus for preparing a sample for optical analysis comprises the steps of setting the apparatus to an automatic or manual mode once power is supplied to the apparatus, opening a door of the apparatus leading to a processing chamber, moving the chuck to a wafer loading position with the door opened, closing the door after the wafer has been loaded on the chuck, driving the chuck to a processing location in the processing chamber, fixing the wafer in place, directing warm air onto the fixed wafer by controlling the gas-supplying means for a certain time, opening the door after the warm air has been directed onto the wafer, driving the chuck to an unloading position, and returning the door and chuck to home positions.

It is to be understood that both the foregoing general description and the following detailed description are exemplary and explanatory and are intended to provide further explanation of the invention as claimed.

BRIEF DESCRIPTION OF THE DRAWINGS

The accompanying drawings illustrate embodiments of the invention, in which.

DETAILED DESCRIPTION OF THE PREFERRED EMBODIMENTS

Reference will now be made in detail to the preferred embodiments of the present invention, examples of which are illustrated in the accompanying drawings.

An embodiment of a method of preparing a sample for optical analysis of the contaminants of the wafer oxide film will be described with respect to FIG. 3 and FIGS. 4A to 4D.

Figure 1:
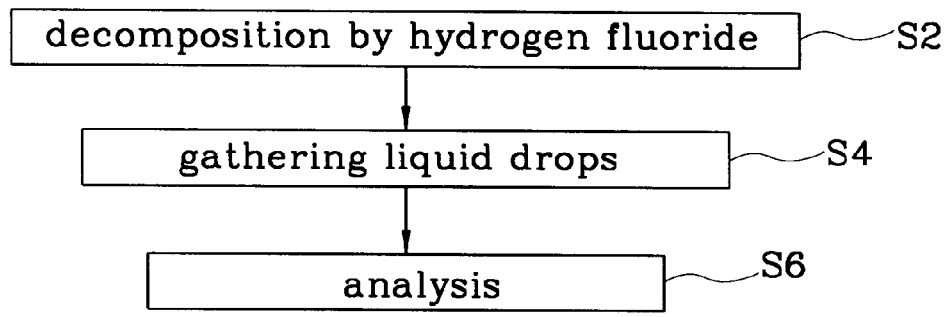
FIG. 1 is a flow chart of a conventional method of preparing a sample for optical analysis in the manufacture of semiconductor devices.
Figure 2A:
FIGS. 2A, 2B and 2C are cross-sectional views of a wafer processed according to the conventional method.
Figure 2B:
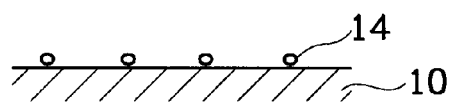
Figure 2C:
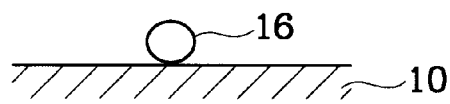
Figure 3:
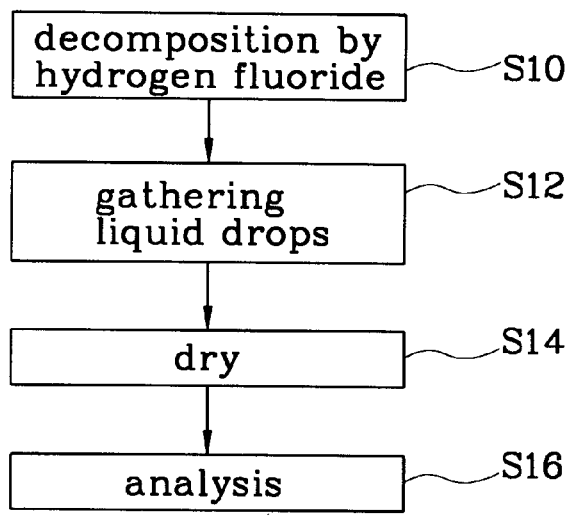
FIG. 3 is a flow chart of a method of preparing a sample for optical analysis in the manufacture of semiconductor devices according to the present is invention.

Referring to FIG. 3, a 5 Å–10 Å thick layer of $SiO_2$ film 12 on a wafer is decomposed by a hydrogen fluoride solution (S10), and the dispersed liquid drops 14 are gathered into a single larger drop 16 (S12). The gathered liquid drop 16 is then reduced a certain amount (S16) to produce a concentrated liquid drop 18. The optical analysis is then performed on the concentrated liquid drop 18.

Figure 4A:
FIGS. 4A, 4B, 4C and 4D are cross-sectional views of a wafer being processed according to the present invention.
Figure 4B:
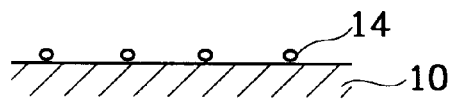
Figure 4C:
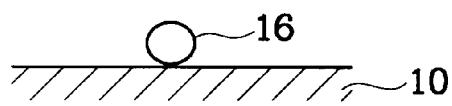
Figure 4D:
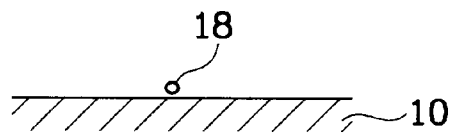

As described above, the $SiO_2$ film 12 formed on the wafer in FIG. 4A is removed by a 1% hydrogen fluoride solution, and as a result, deionized water having decomposed residue is formed into a plurality of liquid drops 14 on the wafer 10 as shown in FIG. 4B.

The dispersed liquid drops 14 are gathered (S12) into one liquid drop 16 (FIG. 4C) by tipping or vibrating the wafer. The single liquid drop 16 is either left to dry for a certain period of time, or is force-dried, i.e., blown dry or heated. The drying process (S14) evaporates the deionized water of the liquid drop 16 to increase the concentration of the contaminants of the liquid drop to form a concentrated liquid drop 18.

The time for the drying process varies with regard to certain parameters, including, but not limited to, the type of liquid drop containing the contaminants and the temperature of the heated air. While the drying process is generally on the order of a few minutes, the precise drying time for a particular application could readily be ascertained by one of ordinary skill in the art without undue experimentation.

After the liquid drop 18 having a concentration of contaminants suitable for optical analysis is formed, the contaminants inside the liquid drop 18 are analyzed (S16) by using an atom absorption optical analyzer or a reflection X-ray analyzer.

Although the above-described process is used for analyzing the contaminants in the $SiO_2$ film 12, the present invention can also be applied to analyzing the contaminants in the chemicals used in the semiconductor manufacturing process, such as hydrogen fluoride, hydrogen peroxide, sulfuric acid, nitric acid, or developer, etc., as well as those in the deionized water.

Figure 5:
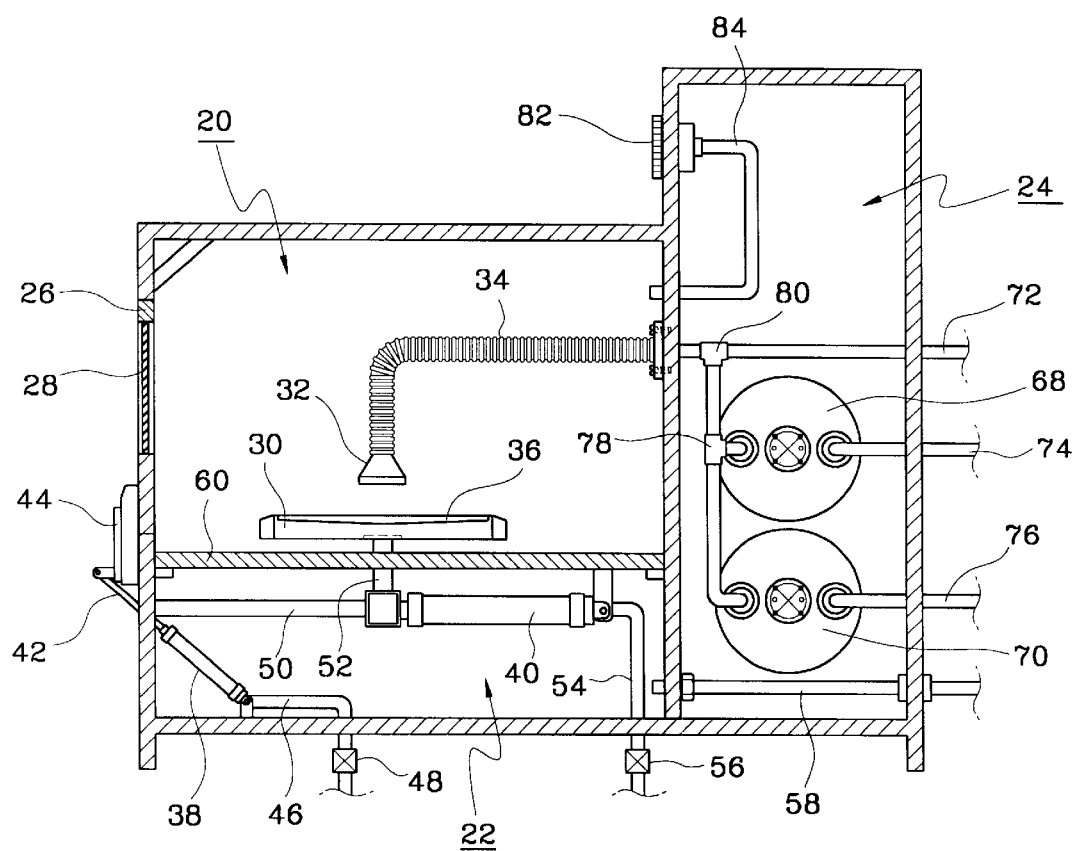
FIG. 5 is a side sectional view of one embodiment of an apparatus for preparing a sample according to the present invention.

In each case, if the volume of the liquid drop including a certain amount of contaminants is decreased as a result of being dried for a certain amount of time, the concentration of the contaminants therein is increased proportionally to the decrease in its volume. The dried liquid drop can therefore be analyzed using an atom absorption optical analyzer or a reflection X-ray optical analyzer. The apparatus for forming such a dried liquid drop for optical analysis is shown in FIG. 5.

The apparatus includes a processing chamber 20, a loading chamber 22 disposed at the bottom of the processing chamber 20, and pipe room 24 located at the back of the processing chamber 20 and the loading chamber 22.

Figure 6:
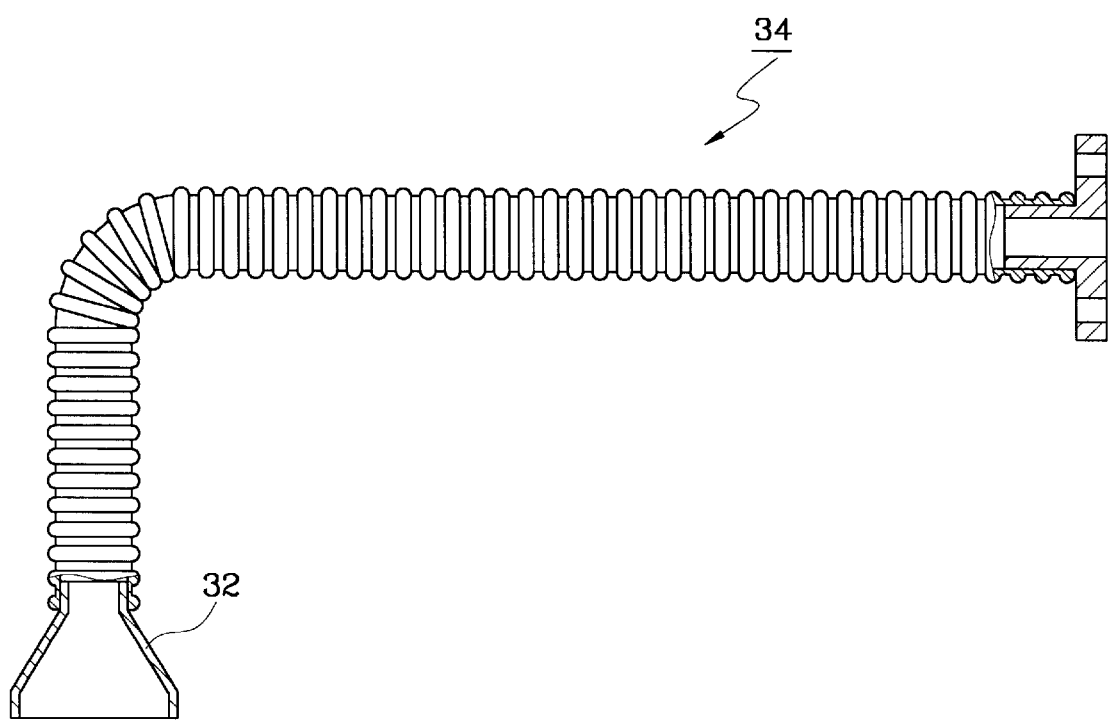
FIG. 6 is a side sectional view of a gas-supplying pipe of the apparatus shown in FIG. 5.

A door 26 is provided at the front of the processing chamber 20, and a window 28 for seeing inside the processing chamber 20 is located in the door 26. Further, a chuck 30 is disposed at the center of the bottom of the processing chamber 20. A pipe 34 extends above the chuck 30. One end 32 of the pipe 34 is tapered and the other end thereof is located on the wall next to the pipe room 24. An enlarged view of the pipe 34 is shown in FIG. 6.

The chuck 30 has a concave surface 36 on which a wafer is placed. This surface 36 has a size corresponding to that of a wafer. Liquid drops are gathered at the center of the wafer by adhering the wafer to the chuck 30 using a vacuum, which action flexes the wafer about its center.

In addition, the loading chamber 22 contains a piston cylinder 38 for opening the door 26 and a piston cylinder 40 for driving the chuck 30.

A load extended part 42 of the piston cylinder 38 is hinged to a door assembly 44 fixed to the bottom of the door 26. The door 26 is opened and closed by the door assembly 44 and load extended part 42. The bottom of the piston cylinder 38 is fixed to the floor of the loading chamber 22 and a pipe 46 for supplying nitrogen gas is connected to the piston cylinder 38. A hydraulic pressure valve 48 controls the supply of nitrogen gas.

The piston cylinder 40, on the other hand, is fixed to the top of the loading chamber 22 along with a guide 50 for guiding the chuck 30. The guide 50 is inserted into the chuck assembly 52 which holds the chuck 30. The chuck assembly 52 is integrated with the piston cylinder 40 so as to be reciprocated thereby. The chuck 30, which is interlocked with the chuck assembly 52, can thus be driven toward and away from the door 26.

In addition, the bottom of the piston cylinder 40 is connected to a conduit 54. A hydraulic pressure control valve 56 is installed in the conduit 54 for controlling the supply of nitrogen gas to the cylinder 40.

A discharge pipe 58 extends from the loading chamber 22 through the pipe room 24. The discharge pipe 58 is connected to a pump (not shown) for discharging gas from the processing chamber 20 and the loading chamber 22.

Figure 7:
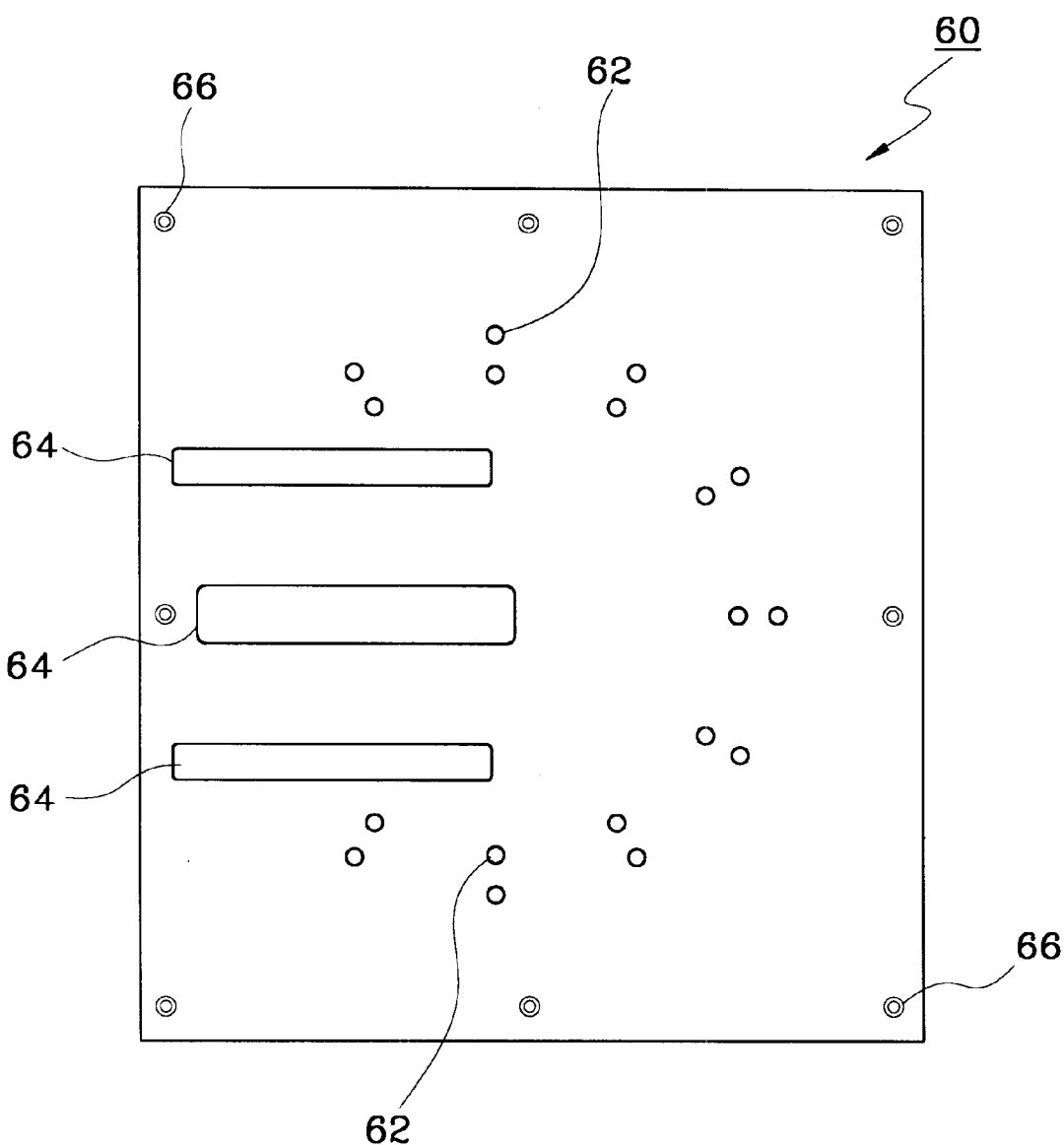
FIG. 7 is a plan view of a room-dividing plate 60 of the apparatus shown in FIG. 5.

The processing chamber 20 and the loading chamber 22 are divided by a plate 60 shown in the plan view in FIG. 7. The plate 60 has a plurality of holes 62, three long slits 64 for receiving the chuck assembly 52, and screw holes 66 by which the plate 60 is fastened in place to divide the processing chamber 20 and the loading chamber 22.

A cooling tank 68 and a heating tank 70 are installed in the pipe room 24. In the pipe room 24, nitrogen gas is induced from the outside through pipes 72, 74, 76. The pipe 74 is connected to the intake side of the cooling tank 68, and the pipe 76 is connected to the intake side of the cooling tank 70. Pipes from the discharge side of the cooling tank 68 or the heating tank 70 are connected to one end of a T-shaped valve 78. A pipe extending from the other end of the T-shaped valve 78 is connected to a T-shaped valve 80. The other end of the T-shaped valve 80 is connected to a pipe which in turn is connected to the pipe 34 inside the processing chamber 20.

In addition, a pressure gauge 82 is provided at the top of the pipe room 24. A pressure sensing pipe 84 at the backside of the pressure gauge 82 extends through the wall dividing the pipe room 24 and the processing chamber 20. Accordingly, the pressure inside the processing chamber 20 can be checked through the pipe room 24.

Figure 8:
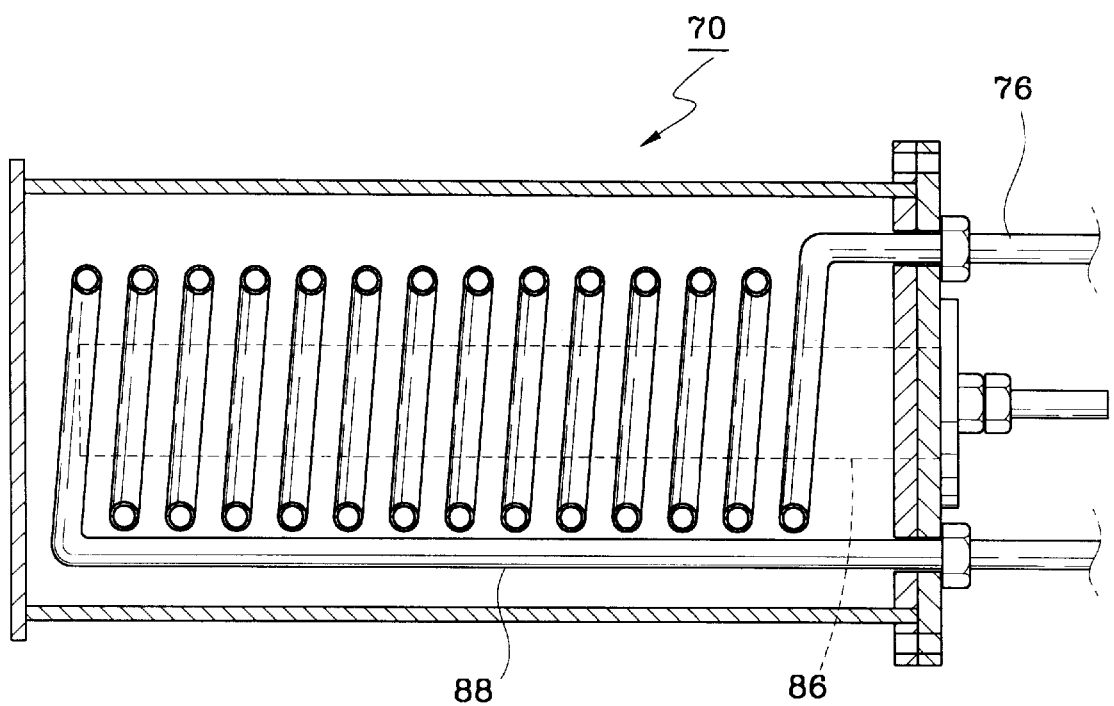
FIG. 8 is a cross-sectional view of a heating tank of the apparatus shown in FIG. 5.

The heating tank 70 as seen in FIG. 8 has a pipe 88 which is coiled around a heating block 86. Nitrogen gas induced through the pipe 76 is discharged from the tank 70 through the pipe 88. The cooling tank 68 can comprise any known refrigeration device capable of adequately cooling the nitrogen gas.

Figure 9:
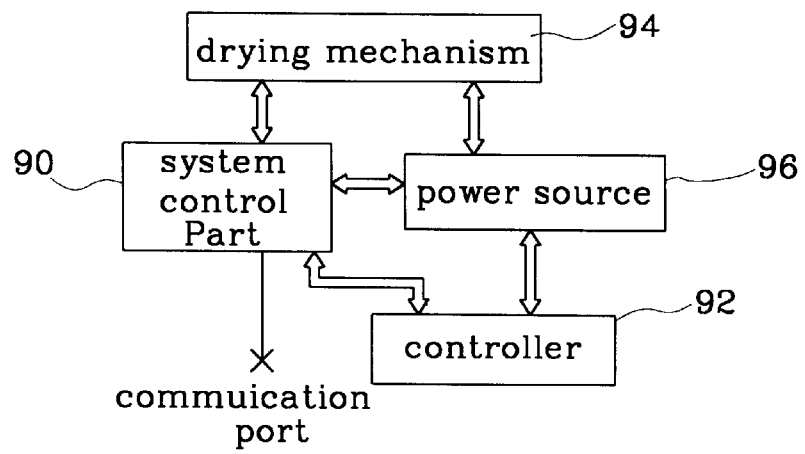
FIG. 9 is a block diagram of a control system of the apparatus shown in FIG. 5.

The apparatus for forming liquid drops for optical analysis is controlled, on the whole, by the programable logic circuit shown in FIG. 9. The control program is installed in the system control part 90, and the system control part 90 is designed to receive program signals from buttons of a controller 92. The system control part 90 transfers control signals, based on the program signals supplied by the controller 92, to a drying mechanism 94 comprising the valves and piston cylinders of the apparatus in FIG. 5. A power source 96 supplies power to the system control part 90, the controller 92, and the drying mechanism 94. In addition, the system control part 90 has a communications device (not shown) for connection with the outside and a communications port for connection with a host computer (also not shown).

Figure 10:
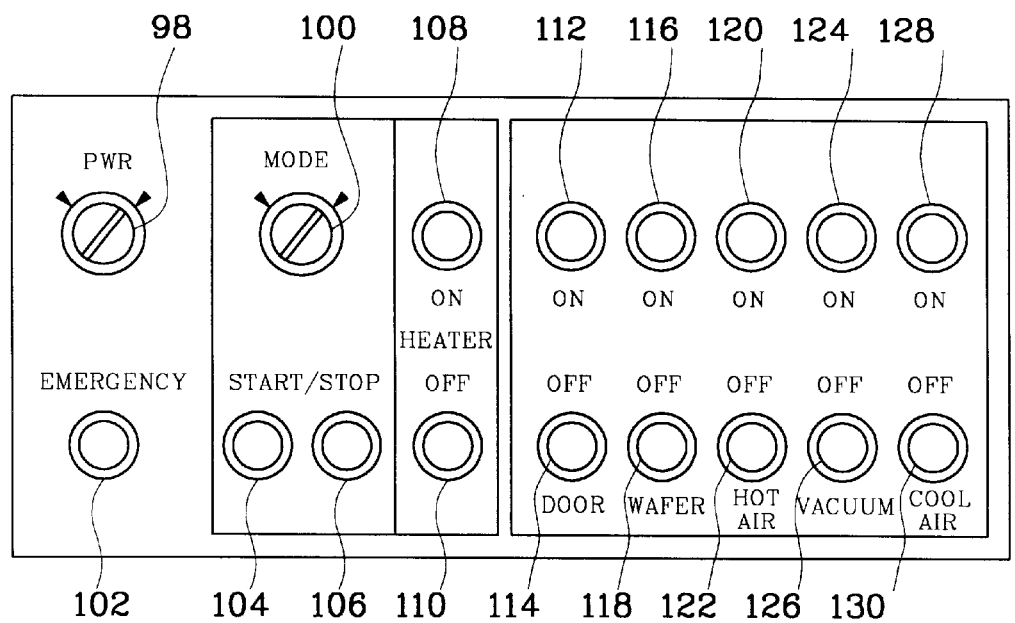
FIG. 10 is a front view of a control panel of the control system shown in FIG. 9.

As shown in FIG. 10, the controller 92 has a power cut-off switch 98, a mode switch 100, an emergency button 102, a system start button 104 and a system stop button 106, a heater on button 108 and a heater off button 110, a door open button 112 and a door close button 114, a chuck loading button 116 and a chuck unloading button 118 for transferring a wafer, a hot air supply button 120 and a hot air cut-off button 122, a vacuum on button 124 and a vacuum off button 126, and a cool air supply button 128 and a cool air cut-off button 130 as seen in FIG. 10.

Figure 11:
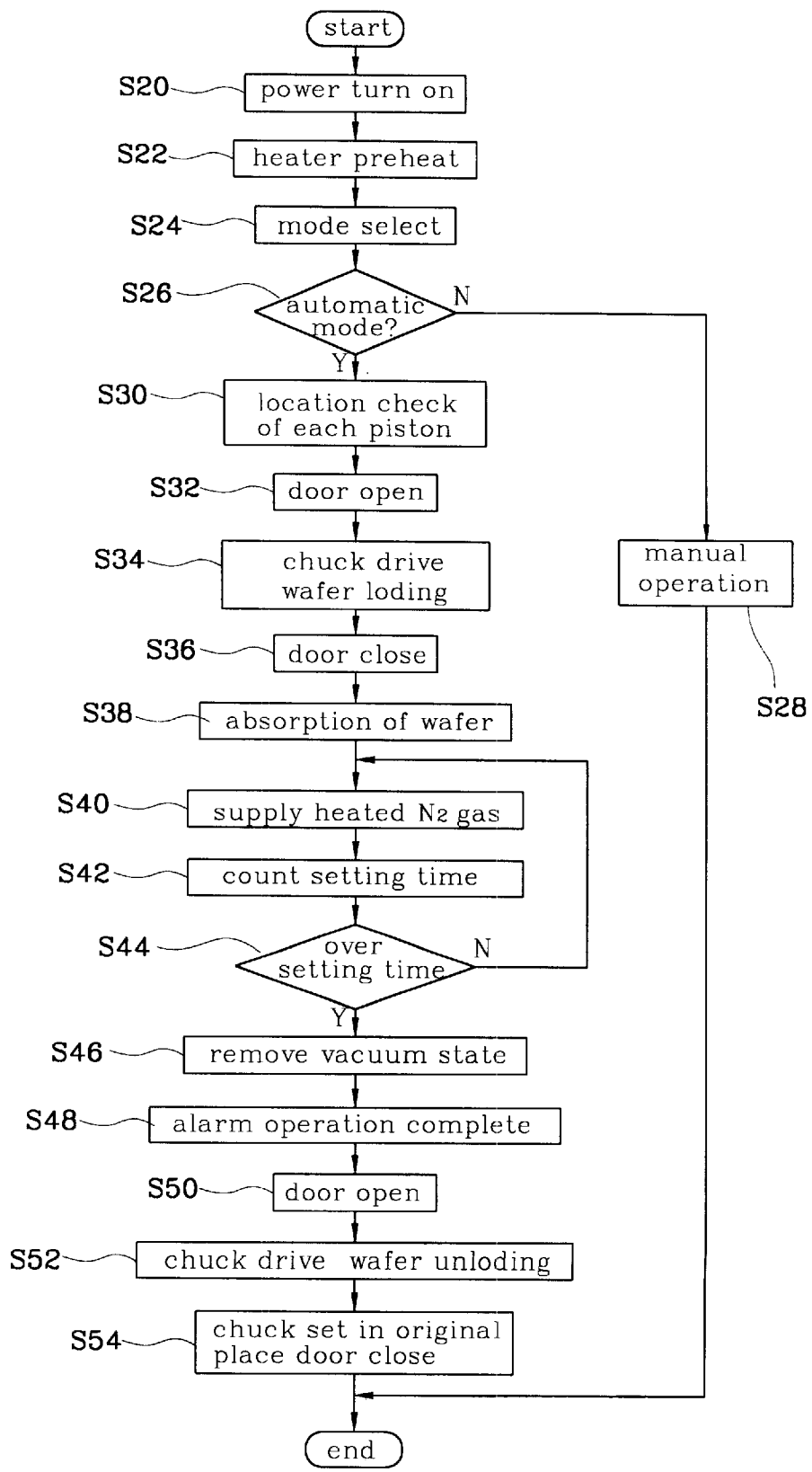
FIG. 11 is a flow chart of a method of controlling the apparatus for preparing a sample for optical analysis according to the present invention.

The detailed operation of the programmable logic circuit will be described referring to FIG. 11. The apparatus for forming a liquid drop for optical analysis can be controlled in either an automatic mode or a manual mode. In the automatic mode, the opening of door 26, the driving of the chuck 30, and the supplying of the nitrogen gas are conducted automatically and sequentially. In the manual mode, those operations occur only after the operator has pushed the appropriate buttons.

In step S20, the power is turned on for driving the apparatus, and power is supplied from the power source 96. Accordingly, in step S22, the heating block 86 of the heating tank 70 inside the drying mechanism 94 is heated.

After that, the mode switch 100 is used to select a mode. In step S26, if the selected mode is manual, the manual operations will be carried out by the operator as represented by step S28. That is, the operator pushes the buttons on the controller 92 to operate the apparatus.

On the other hand, if in step S26 the automatic mode is selected, the current location of each piston cylinder 38, 40 is checked in step S30, and the door 26 is opened by driving the piston cylinder 38 in step S32. When the door 26 is opened in step S34, the chuck 30 is automatically moved by the piston cylinder 40 toward the door, and the wafer is loaded onto the chuck 30.

Once the wafer has been loaded on the chuck 30, the door 26 is closed by the piston cylinder 38, and the chuck 30 is set in its original position by driving the piston cylinder 40 away from the door. After that, in step S38, the chuck 30 induces a vacuum so that the wafer is adhered to the chuck 30 and is flexed about its center. The chuck 30, having a conventional structure, is vibrated so that the liquid drops gather at the center of the wafer surface.

Meanwhile, after the wafer has been adhered to the chuck 30, heated nitrogen gas is supplied to the pipe 34 in step S40. The T-shaped valves 78, 80 are opened to discharge nitrogen gas from the heating tank 70 to the pipe 34.

The deionized water of the liquid drop on the center of the wafer surface is evaporated by the nitrogen gas. The total time required for supplying the heated nitrogen gas is programmed in the system control part 90, and this time is checked by a counter in steps S42 and S44.

If the total time has elapsed, the vacuum of the chuck 30 is relieved, and an alarm signaling the completion of the operation is issued in step S48. The alarm can be a separate communications device or an integral part of the host computer.

After the alarm has been issued in step S48, the door 26 is opened in step S50, the chuck 30 is driven to a position outside the processing chamber in step S52 and the wafer is unloaded, the door 26 is closed in step S54, and the chuck 30 is returned to its home position, whereby the automatic operation is completed.

As a result of the above apparatus and method, and with reference to FIGS. 4A to 4B, liquid drops 14, which are spread over the entire surface of the wafer, are gathered into a single larger liquid drop 16. This larger liquid drop 16 thus contains contaminants that were present over the entire wafer surface. The single liquid drop 16 is subjected to a drying process, which evaporates the deionized water of the liquid drop to increase the concentration of the contaminants of the liquid drop to a level suitable for analysis.

The present invention can also be applied to analyzing the contaminants in the chemicals used in the semiconductor manufacturing process, such as hydrogen fluoride, hydrogen peroxide, sulfuric acid, nitric acid, or developer, etc., as well as those in the deionized water.

In another embodiment, the above apparatus and method for preparing a sample for optical analysis in the manufacture of semiconductor devices can be used as a simulation tool for freezing the buffer oxide etchant used in the manufacturing process.

For this, nitrogen gas which has been cooled in the cooling tank 68 is fed to the pipe 34. The buffer oxide etchant on the wafer is exposed to the cooled nitrogen gas, whereby the etchant can be optically analyzed. For this process, the apparatus is controlled in the manual mode using the control buttons 128, 130. Therefore, the buffer oxide etchant can be frozen for a certain time.

Although the present invention has been described in detail, it should by understood that various changes, substitutions and alterations can be made thereto without departing from the spirit and scope of the invention as defined by the appended claims.

What is claimed is:

1. A method of preparing a sample for optical analysis of contaminants of a semiconductor device, said method comprising:

producing liquid drops containing contaminants on a semiconductor wafer;

gathering the liquid drops into a single liquid drop; and forcibly drying the liquid to increase the concentration of contaminants therein.

2. The method as claimed in claim 1, wherein said producing liquid drops comprises dissolving a film on the semiconductor wafer with a solvent.

3. The method as claimed in claim 2, wherein said forcibly drying comprises heating the liquid.

4. The method as claimed in claim 2, wherein said forcibly drying comprises blowing air onto the liquid.

5. The method as claimed in claim 4, wherein said forcibly drying comprises blowing warm air onto the liquid.

6. The method as claimed in claim 1, wherein said producing liquid drops comprises forming liquid drops of deionized water used in the semiconductor device manufacturing process.

7. The method as claimed in claim 1, wherein said producing liquid drops comprises forming drops of a chemical to which the wafer is subjected during the semiconductor manufacturing process.

8. An apparatus for preparing a sample for optical analysis in the manufacture of semiconductor devices, said apparatus comprising:

a processing chamber;

a wafer holder which holds a wafer during the preparation of a sample;

a guide along which the wafer holder is guided between a first position inside of the processing chamber and a second position outside of the processing chamber;

a driver which drives the wafer holder between said first and said second positions as guided by said guide;

a gas supplier which introduces a gas onto an upper surface of a wafer held by the wafer holder at said first position; and a controller which controls said gas supplier and said driver, said controller halting introduction of the gas by the gas supplier after a certain amount of time.

9. The apparatus as claimed in claim 8, wherein said driver comprises a piston cylinder integrated with said wafer holder, and further comprising a nitrogen gas supply source, and a pipe connecting said piston cylinder to said nitrogen gas supply source such that hydraulic pressure for said piston is created by nitrogen gas supplied through said pipe.

10. The apparatus as claimed in claim 8, wherein said gas supplier comprises a nitrogen gas supply source, a heater operatively connected to said nitrogen gas supply source so as to heat nitrogen gas thereof, and at least one valve operatively connected between said nitrogen gas supply source and said pipe so as to regulate the amount of heated nitrogen gas fed to said pipe.

11. The apparatus as claimed in claim 8, further comprising a nitrogen gas supply source, a cooling device operatively connected to said nitrogen gas supply source so as to cool nitrogen gas thereof, and at least one valve operatively connected between said nitrogen gas supply source and said pipe so as to regulate the amount of cooled nitrogen gas fed to said pipe.

12. A method of controlling an apparatus for preparing a sample for optical analysis in the manufacture of semiconductor devices, said method comprising:

setting the apparatus to one of an automatic and a manual mode once power is supplied to the apparatus;

opening a door of the apparatus leading into a processing chamber, and driving a chuck of the apparatus from a home position to a wafer loading position while the door is open;

closing the door after the wafer has been loaded onto the chuck;

driving the chuck to a processing position inside the chamber, and fixing the wafer in place with the chuck at said processing position;

operating at least one valve to direct air onto an upper surface of the fixed wafer for a certain amount of time;

opening the door after the air has been directed onto the wafer for said certain amount of time;

driving the chuck to an unloading position at which the wafer can be unloaded; and subsequently closing the door and returning the chuck to the home position thereof.

13. The method of controlling the apparatus as claimed in claim 12, further comprising heating the air, wherein said directing air onto the wafer comprises directing warm air onto the wafer.

14. The method of controlling the apparatus as claimed in claim 12, further comprising cooling the air to a temperature at which buffer oxide etchant will freeze, wherein said directing air onto the wafer comprises directing cold air onto the wafer that will freeze buffer oxide etchant on the wafer.

15. The method as claimed in claim 1, wherein said preparing produces a sample liquid drop reduced in volume from said single liquid drop for use in said optical analysis.

* * * * *